(12) United States Patent
Gotsmann et al.

(10) Patent No.: US 8,969,179 B2
(45) Date of Patent: Mar. 3, 2015

(54) NANOWIRE DEVICES

(75) Inventors: Bernd W Gotsmann, Horgen (CH); Siegfried F. Karg, Adliswil (CH); Heike E. Riel, Baech (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/885,258

(22) PCT Filed: Nov. 2, 2011

(86) PCT No.: PCT/IB2011/054864
§ 371 (c)(1),
(2), (4) Date: May 14, 2013

(87) PCT Pub. No.: WO2012/066444
PCT Pub. Date: May 24, 2012

(65) Prior Publication Data
US 2013/0228751 A1    Sep. 5, 2013

(30) Foreign Application Priority Data

Nov. 17, 2010  (EP) .................................. 10191466

(51) Int. Cl.
*H01L 21/20*       (2006.01)
*H01L 21/02*       (2006.01)
(Continued)

(52) U.S. Cl.
CPC ...... *H01L 21/02603* (2013.01); *H01L 29/0673* (2013.01); *H01L 29/068* (2013.01); *H01L 29/1054* (2013.01); *H01L 29/42392* (2013.01);
(Continued)

(58) Field of Classification Search
CPC ..................... H01L 21/02603; H01L 29/0669; H01L 2221/1094
USPC .................... 257/9, 24, 14, 22, 208, E29.069, 257/E21.09; 438/762, 938
See application file for complete search history.

(56) References Cited

U.S. PATENT DOCUMENTS

2008/0276979 A1   11/2008  Lagally et al.
2009/0242990 A1   10/2009  Saitoh
(Continued)

FOREIGN PATENT DOCUMENTS

WO   WO 02/080280 A1   10/2002
WO   WO 2008/047847 A1   4/2008
(Continued)

OTHER PUBLICATIONS

PCT International Search Report and Written Opinion; International Application No. PCT/IB2011/054864; International Filing Date: Nov. 2, 2011; Date of Mailing: Apr. 17, 2013; pp. 1-10.

*Primary Examiner* — Jarrett Stark
*Assistant Examiner* — Shahed Ahmed
(74) *Attorney, Agent, or Firm* — Cantor Colburn LLP

(57) ABSTRACT

A method of forming nanowire devices. The method includes forming a stressor layer circumferentially surrounding a semiconductor nanowire. The method is performed such that, due to the stressor layer, the nanowire is subjected to at least one of radial and longitudinal strain to enhance carrier mobility in the nanowire. Radial and longitudinal strain components can be used separately or together and can each be made tensile or compressive, allowing formulation of desired strain characteristics for enhanced conductivity in the nanowire of a given device.

13 Claims, 4 Drawing Sheets

(51) Int. Cl.
| | |
|---|---|
| *H01L 29/06* | (2006.01) |
| *H01L 29/10* | (2006.01) |
| *H01L 29/423* | (2006.01) |
| *H01L 29/66* | (2006.01) |
| *H01L 29/775* | (2006.01) |
| *H01L 29/786* | (2006.01) |
| *B82Y 10/00* | (2011.01) |
| *B82Y 40/00* | (2011.01) |

(52) U.S. Cl.
CPC .... *H01L 29/66439* (2013.01); *H01L 29/66469* (2013.01); *H01L 29/775* (2013.01); *H01L 29/78687* (2013.01); *H01L 29/78696* (2013.01); *H01L 29/0669* (2013.01); *B82Y 10/00* (2013.01); *B82Y 40/00* (2013.01)

USPC .......................................................... 438/478

(56) References Cited

U.S. PATENT DOCUMENTS

| | | | |
|---|---|---|---|
| 2009/0289244 A1* | 11/2009 | Pryor et al. ...................... 257/22 |
| 2010/0193770 A1* | 8/2010 | Bangsaruntip et al. ......... 257/24 |
| 2010/0252801 A1* | 10/2010 | Sekaric et al. .................... 257/9 |

FOREIGN PATENT DOCUMENTS

| | | |
|---|---|---|
| WO | WO 2008/079077 A2 | 7/2008 |
| WO | WO2008079077 | 7/2008 |
| WO | WO2011009762 | 1/2011 |

* cited by examiner

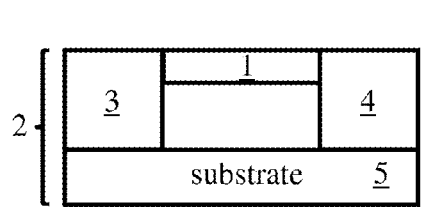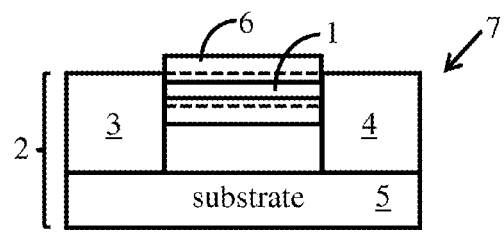
Figure 3a    Figure 3b
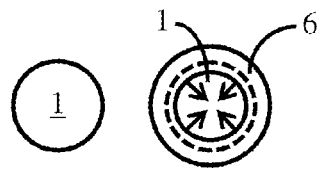
Figure 3c
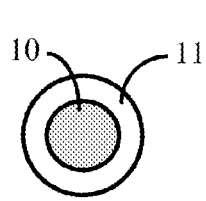 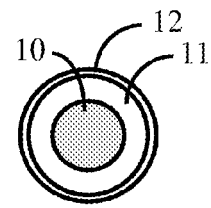 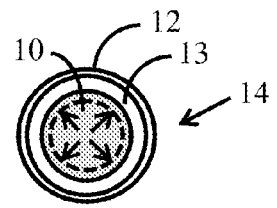
Figure 4a    Figure 4b    Figure 4c
30
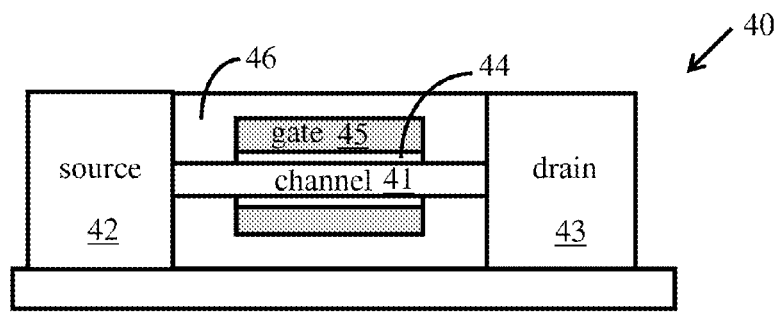
Figure 7

NANOWIRE DEVICES

CROSS-REFERENCE TO RELATED APPLICATION

This application is a National Phase Application based on PCT/IB2011/054864 which claims priority from European Patent Application No. 10191466.1 filed Nov. 17, 2010, the entire contents of both of which are incorporated herein by reference.

This invention relates generally to nanowire devices and methods for forming such devices.

Semiconductor devices are subject to ever-more-stringent size constraints. The development of improved device architectures to meet these constraints is a constant challenge. In response to this challenge, devices based on semiconductor nanowires are currently under development. These "nanowires" are elongate, thin (sub-micron) wires which can be formed from semiconductors using lithographic processing or growth techniques. Nanowires generally have a thickness of up to about 200 nm, and more usually nearer 50 nm, with thicknesses from about 2 nm to about 50 nm being most typical at present. The cross-sectional shape of nanowires can vary, common examples including rounded (e.g. circular) cross-sections as well as generally rectangular cross-sections giving a ribbon-shaped nanowire or "nanoribbon". Nanowires may be embodied in a variety of devices in microelectronic circuitry, a common application in MOS (metal oxide semiconductor) technology being as the channel structure of FET (field effect transistor) devices. Nanowire FETs can exploit a "surround-gate" arrangement in which the gate stack is formed as a generally cylindrical structure surrounding the nanowire channel.

In planar MOS technology, strained silicon has been used to increase the carrier mobility in the channel of FETs. The basic process here is illustrated in FIGS. 1a to 1d of the accompanying drawings. A layer of $Si_xGe_{1-x}$ is initially grown as illustrated schematically in FIGS. 1a and 1b. Since germanium has a larger lattice constant (5.65 Å) than silicon (5.4 Å), the resulting crystal structure is larger. In a subsequently-grown silicon layer as indicated in FIG. 1c, the silicon atoms try to align according to the expanded SiGe lattice. The SiGe base layer thus serves as a stressor for the overlaid silicon layer. As a result, the final silicon layer is in tensile strain ($\Delta L/L > 0$, where L represents length parallel to the surface) as illustrated in FIG. 1d. To produce the final transistor structure as illustrated schematically in FIG. 2, the gate stack is completed by overlaying the strained silicon with a gate dielectric and gate electrode.

A planar silicon layer can also be subjected to strain by thermal oxidation, the volume being enlarged by the incorporated oxygen atoms so that the Si surface atoms are in tensile strain. Silicon nitride has also been used as a stressor layer on top of the gate in some planar transistor architectures to induce strain in the silicon channel.

In nanowire geometry, a strained Si channel can be realized by providing a SiGe core and growing a strained Si shell around that core. A gate stack and source and drain contacts on the ends of the nanowire complete the strained Si MOS gate-all-around transistor. The current in the channel of such a transistor flows in the strained Si and the SiGe does not contribute to current flow. US Patent Application publication no. US2008/0276979 discloses strained nanowires for thermoelectric applications in which quantum dots arranged in anti-phase on opposite surfaces of a nanoribbon induce a periodic surface strain modulation resulting in anti-correlated positional displacement of the ribbon along its length.

One embodiment of an aspect of the present invention provides a method for forming a nanowire device, the method comprising forming a stressor layer circumferentially surrounding a semiconductor nanowire, the method being performed such that, due to the stressor layer, the nanowire is subjected to at least one of radial and longitudinal strain to enhance carrier mobility in the nanowire.

In embodiments of this invention, therefore, a stressor layer is formed to apply stress to the nanowire and the device is formed in such a manner that the nanowire undergoes strain which enhances conductivity as a result. More specifically, the method may be performed according to embodiments of the invention in such a manner that (by virtue, for example, of the particular materials and/or structure of the stressor layer, nanowire and possibly any other device components, and/or the particular way in which components are formed, individually and/or as a combination, to produce the final device structure as illustrated below) the effect of the stressor layer is to produce the appropriate one or combination of radial and longitudinal strain in the nanowire to enhance its carrier mobility. Because the stressor layer circumferentially surrounds the nanowire, radial strain can be induced in addition (or as an alternative) to longitudinal strain. Thus, according to embodiments of the invention the strain that can be exploited to enhance conductivity is not limited to strain parallel to the surface. By appropriate choice of materials and method steps, radial and longitudinal strain components can be used separately or together and can each be made tensile or compressive. Hence, methods embodying this invention can effectively formulate the desired strain characteristics, using tensile/compressive radial and/or longitudinal strain components to achieve optimum conductivity for the nanowire in question. Moreover, the entire nanowire core of the resulting device can be used as the conductive element, e.g. the channel in a FET device, as opposed to merely the outer shell of the prior strained Si nanowire structure described above. This allows smaller-diameter nanowires to be employed, facilitating reduction of device dimensions and promoting overall efficiency.

According to embodiments of the invention the stressor layer circumferentially surrounds the nanowire, extending substantially all the way round the circumferential perimeter of the nanowire. In general, the stressor layer may be formed on all or only part of the longitudinal extent of the nanowire (which may in some cases have some additional structure, such as a wrap-around gate, already formed around a section thereof) and need not be entirely continuous or homogeneous. For example, patterned or random discontinuities may be envisaged, providing the layer as a whole encloses, or encircles, the nanowire around its circumference. It is because the stressor layer circumferentially surrounds the nanowire that radial strain can be exploited in the device. This feature also enables uniform longitudinal strain, generally parallel to the longitudinal axis of the nanowire, to be achieved whereby undesirable distortion of the nanowire can be avoided. In particularly preferred embodiments, the stressor layer is formed as a substantially homogeneous coating. This simplifies processing and allows uniform strain characteristics to be achieved whereby irregularities such as positional deformities (bowing, bending, etc.) can be avoided.

In embodiments of the invention, the nanowire may be formed so that it is fixed initially at both or only one of its ends. The wire may be formed with a variety of shapes in cross-section, but should be freely accessible on all sides around its circumference (at least over part of its length) to allow subsequent formation of the surrounding stressor layer. In preferred embodiments, the nanowire is formed with a rounded, and most preferably substantially circular, cross-section. Other, more angular cross-sections, e.g. generally rectangular, trapezoid, hexagonal, etc., cross-sections, are also possible however, and the term "radial" as used herein should be construed accordingly. In particular, radial strain in a nanowire should be construed to cover strain directed generally inwardly or outwardly towards or from the interior of the nanowire. Compressive radial strain includes strain directed generally inwardly from the circumference towards a central region or point of the nanowire. Tensile radial strain includes strain directed generally outwardly from a central region or point of the nanowire towards the circumference. Such radial strain constitutes a further strain component distinct from longitudinal strain which is aligned in the general direction of the longitudinal axis of the nanowire. When subject to these strain components, the nanowire increases or decreases in size radially or longitudinally according to whether the corresponding strain component is tensile or compressive.

A nanowire device embodying the invention may be as simple as the nanowire with surrounding stressor layer, possibly with a supporting structure, or may be a more complex device incorporating additional components such as a FET device. The semiconductor nanowire itself may be formed in any convenient manner to obtain a nanowire with semiconducting properties. Hence, some methods embodying the invention may include forming the nanowire of semiconducting material, where the semiconducting material here may comprise one or more component materials and could, for instance, comprise a pure semiconductor, a compound semiconductor or a semiconductor heterostructure. Other embodiments may include forming the nanowire of semi-metal material, wherein the strain induced by the stressor layer renders the semi-metal material semiconducting. For example, a stressor layer appropriately applied to produce radial compressive strain and/or longitudinal tensile strain can cause the thickness of a semi-metal nanowire to be reduced below the threshold at which the semi-metal becomes a semiconductor.

The stressor layer may be formed in a variety of ways such that the required strain is induced in the nanowire in the final device. In some embodiments, the method may include forming the stressor layer of material which is inherently adapted to apply stress to the nanowire. That is, due to inherent or intrinsic properties of the material of the stressor layer the formation of the layer itself applies stress to the nanowire. This may be due, for instance, to differences in crystal structure between the stressor layer and nanowire, e.g. differences in lattice constants, or the particular bonding angles at the material interface resulting in intrinsic growth stress, or due to differences in thermal expansion coefficients of the stressor layer and nanowire. In other embodiments, the method may include forming the stressor layer by forming a preliminary layer on the nanowire, and then processing the preliminary layer to activate the preliminary layer to apply stress to the nanowire. In these embodiments, therefore, post-processing of the previously-formed preliminary layer causes stress to be applied to the nanowire. Such a preliminary layer may be formed, for instance, of a material which undergoes a volume change on post processing, e.g. due to an amorphous/crystalline phase transition induced by a heat treatment. In some cases these methods may include, prior to post-processing the preliminary layer, forming a fixation layer over the preliminary layer substantially to maintain the outer surface geometry of the preliminary layer during the post-processing to facilitate activation of the layer as a stressor layer. This technique will be illustrated by example below. Such a fixation layer may be implemented by a thin stratum or by a bulk material, the term "layer" being used herein in its most general sense without implying any particular limitation on thickness.

In general, the stressor layer may be formed in a variety of ways and of a variety of materials as required to give the desired strain characteristics in a particular nanowire in the final device. As illustrated by examples below, in some cases the stressor layer may be removed after subjecting the nanowire to the required strain, strain then being maintained by support structures attached to the nanowire. Many factors affect the nature and degree of strain experienced by the nanowire due to the stressor layer. These factors include materials, interface chemistry, dimensions, layer formation processing and overall process steps in producing the final device. The particular effect of strain on carrier mobility in the nanowire also depends on various factors such as materials, carrier type, dimensions, and whether strain is radial or longitudinal, compressive or tensile, or some combination of these. By consideration of these factors, stressor layer formation and device processing steps can be adapted to produce appropriate strain characteristics to achieve a desired effect on carrier mobility. This will be discussed in greater detail, and illustrated by examples, hereinafter.

An embodiment of a second aspect of the invention provides a nanowire device comprising a semiconductor nanowire having a stressor layer circumferentially surrounding the nanowire, the arrangement being such that the nanowire is subjected by the stressor layer to at least one of radial and longitudinal strain to enhance carrier mobility in the nanowire.

An embodiment of a third aspect of the invention provides a Field Effect Transistor (FET) comprising a nanowire and a gate structure, the gate structure comprising a dielectric and a gate electrode, surrounding a channel portion of the nanowire, the FET further comprising source and drain regions at respective ends of the nanowire, wherein the nanowire is subjected to at least one of radial and longitudinal strain to enhance carrier mobility in the nanowire.

In general, where features are described herein with reference to a method embodying the invention, corresponding features may be provided in a device embodying the invention, and vice versa.

Preferred embodiments of the invention will now be described, by way of example, with reference to the accompanying drawings in which:

FIGS. 1a to 1d illustrate stages in fabrication of a strained silicon layer in prior planar transistor technology;

FIG. 2 indicates the structure of a prior planar MOSFET with a strained silicon channel;

FIGS. 3a to 3c illustrate a first method embodying the invention for forming a nanowire device;

FIGS. 4a to 4c illustrate a second method embodying the invention for forming a nanowire device;

FIG. 7 is a schematic illustration of a FET embodying the invention.

Figure 1A:
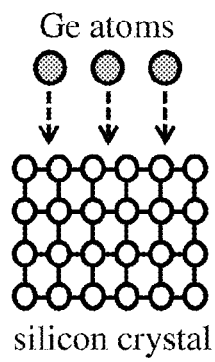
Figure 1B:
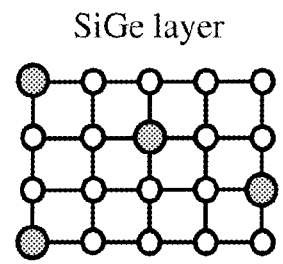
Figure 1C:
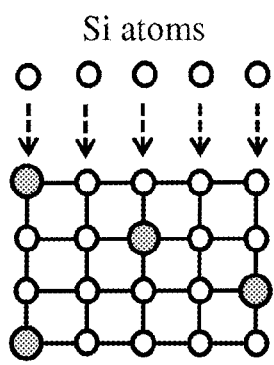
Figure 1D:
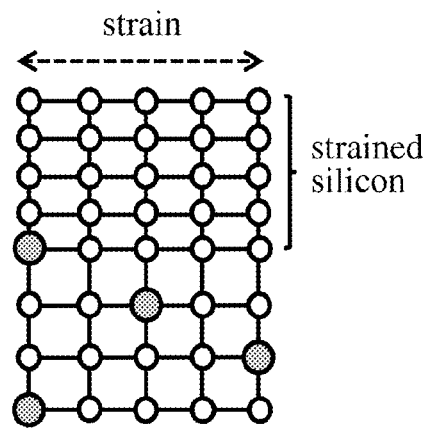
Figure 2:
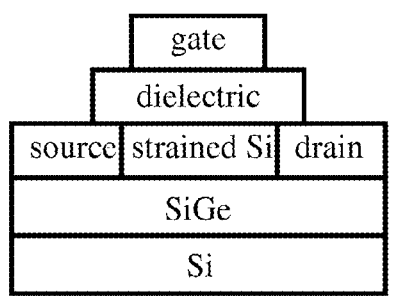

Before presenting a detailed description of exemplary embodiments of the invention, it is useful to expand on some basic principles underlying these embodiments.

Common to the embodied methods of forming a nanowire device described below is the formation of a stressor layer circumferentially surrounding a semiconductor nanowire, whereby the stressor layer applies stress to the nanowire. In each case, the method is performed in such a manner that, due to the effect of the stressor layer, the nanowire in the resulting device is subjected to at least one of radial and longitudinal strain to enhance its carrier mobility. While illustrative examples are given below, in general the stressor layer may be formed in a variety of ways and of a variety of materials as required to give the desired strain characteristics in the nanowire of a given device. As will be understood by those skilled in the art, many factors affect the nature and degree of strain that will be induced in a particular nanowire by a particular stressor layer. These factors include the particular interface chemistry between the materials in question, e.g. how the chemical bonds are formed and the particular lengths and angles of these bonds, and the crystal structure of the materials e.g. lattice constants and crystal directions. As well as materials, the dimensions, e.g. thicknesses, of the stressor layer and nanowire are also relevant to strain characteristics. A thicker stressor layer may apply more stress, and so (subject to inherent physical limits) induce more strain, and a thinner nanowire may be more easily strained. Layer formation is also relevant as stress tends to build up during layer deposition/processing, and any additional processing steps involved in producing the final device may also affect the final strain characteristics in the nanowire.

It will also be understood by those skilled in the art that the effect of particular strain characteristics on carrier mobility in the nanowire depends on various factors. These include materials, crystal structure, carrier type, current flow direction, and whether strain is radial or longitudinal, compressive or tensile, or some combination of these. By way of illustrative example, consider a process involving production of an oxide stressor layer by thermal oxidation of a nanowire. Along the wire axis the oxidation tends to produce tensile strain due to incorporation of oxygen atoms. In the radial direction, however, the oxidation tends to produce compressive strain as the oxidation front moves from the surface to the interior of the nanowire. As a result, changes in electron mobility due to radial and longitudinal strain can at least partially compensate each other. Moreover, if the nanowire is clamped at both ends so that the wire cannot expand longitudinally, the applied stress cannot induce longitudinal strain ($\Delta L/L=0$), and only the radial strain component can be exploited.

By consideration of the above factors, the materials, the stressor layer formation and overall device processing steps (e.g. formation and/or removal of structures which prevent/cause a nanowire to take up radial/longitudinal strain components) can be selected as required for a given device. In particular, knowledge and consideration of these various factors allows the strain characteristics to be tailored to achieve a desired improvement in carrier mobility and hence enhanced device performance. Appropriate materials, parameters and processing steps for particular embodiments will be apparent to those skilled in the art from the description herein.

Specific examples of methods embodying the invention will now be described.

FIGS. 3a and 3b are schematic illustrations of successive stages in a first method embodying the invention. The first stage of the method involves fabrication of a semiconductor nanowire 1. In this example, the nanowire is formed from an SOI (silicon-on-insulator) wafer 2 using generally known processing techniques. Briefly, the nanowire 1 and support structures 3, 4 attached to the ends of the nanowire are initially defined by lithography and dry etching of the upper silicon layer of wafer 2. At this stage the partially-formed wire still lies on the substrate 5 of the wafer 2. (Though not shown separately in the figure, the substrate 5 here comprises the wafer's insulating (oxide) layer and an underlying silicon carrier layer). The wire is then under-etched so that no contact to substrate 5 exists. This results in the structure shown in FIG. 3a where the nanowire 1 extends between the two support structures 3, 4 attached to its ends. The resulting nanowire 1 is substantially circular in cross-section as illustrated on the left of FIG. 3c. In this example the nanowire has a diameter of about 5 to 15 nm. The next stage involves formation of a stressor layer for the nanowire. In this embodiment the stressor layer is formed as a layer of oxide applied selectively to the nanowire via a process of thermal oxidation by rapid thermal processing in an oxidizing atmosphere. The resulting oxide layer 6 is formed as a substantially homogeneous, conformal coating extending over the entire length of nanowire 1 between end supports 3, 4. In this example, the oxide layer is formed to a thickness of 5 to 15 nm. The device 7 obtained after formation of stressor layer 6 is illustrated schematically in FIG. 3b and the corresponding cross-section through nanowire 1 is shown on the right of FIG. 3c.

Considering the crystal structure and dimensions of silicon nanowire 1 and the material and thickness of stressor layer 6, the effect of the stressor layer here is that the nanowire is subjected to compressive radial strain resulting in a reduction in the nanowire diameter as indicated by the broken lines in FIGS. 3b and 3c. Note that presence of the end support structures 3, 4 in this embodiment prevents the nanowire from undergoing longitudinal strain. The strain is therefore solely perpendicular to the surface of nanowire 1 with no strain component parallel to the surface. Device 7 could then be subjected to further processing steps, such as doping of support structures 3 and 4 and formation of contacts, depending on intended function, and particular examples are described below. In any case, with appropriate choice of carrier type and current flow direction (in particular for holes on (100) or (110) surfaces), an improvement in carrier mobility of about 2 to 10 percent can be expected with this "radial-compressive-strain-only" method.

Note that, while the radial strain is compressive in the above example, if preferable for a different nanowire device (e.g. a device having a different carrier polarity) then tensile radial strain could be produced by appropriate selection and formation of the stressor layer to induce this effect. Appropriate materials and/or processes here will be apparent to those skilled in the art. Moreover, while an oxide layer is formed as the stressor layer in this example, in other embodiments the stressor layer may be formed of different materials. Examples include nitrides (such as silicon nitride, titanium nitride, boron nitride and tungsten nitride), binary oxides (such as silicon oxide, aluminum oxide and hafnium oxide), ternary oxides (such as perovskites e.g. $SrTiO_3$), carbides (such as silicon carbide), and carbon. Various processing techniques can be employed to produce the stressor layer. These may involve diffusion, chemical reaction, chemical vapor deposition (CVD), atomic layer deposition (ALD), physical vapor deposition (PVD), sputter deposition, pulsed laser deposition, molecular beam epitaxy (MBE), chemical beam epitaxy (CBE), metal organic CVD (MOCVD), etc. Suitable layer formation techniques for particular materials will be apparent to those skilled in the art.

FIGS. 4a to 4c are schematic illustrations of a nanowire cross-section at successive stages in a second method embodying the invention. The first stage of the method involves fabrication of a semiconductor nanowire 10 generally as described with reference to FIG. 3a above. In this example, the nanowire is formed from a compound semiconductor, e.g. InAs, and has a diameter of approximately 20 nm. The next stage again involves formation of a stressor layer for the nanowire. In this embodiment, however, the stressor layer is formed by a three-step process. First, as shown in FIG. 4a, a preliminary layer 11 of an amorphous chalcogenide-based alloy (e.g. GeTe) is selectively formed as a conformal coating on nanowire 10 by a process of CVD. The preliminary layer 11 here has a thickness of about 10 to 20 nm. Next, a fixation layer 12 is formed over the preliminary layer 11 as shown in FIG. 4b. The fixation layer here is a layer of TaN, with a thickness of about 10 nm, and is formed by a process of ALD at a temperature below the crystallization temperature of layer 11. In the final step, the preliminary layer 11 is processed to activate this layer to apply stress to nanowire 10. In particular, the device is heated to a temperature above the transition temperature (e.g. 200° C. for GeTe) of the chalcogenide layer 11, and then subsequently cooled. This causes a phase change in chalcogenide layer 11 from its amorphous state to a more dense, crystalline state, with a consequent reduction in specific volume, producing crystalline layer 13. During the phase-change processing, fixation layer 12 maintains the outer surface geometry of preliminary layer 12. Hence the diameter of nanowire 10 with preliminary layer 12 is fixed and expansion/contraction of the overall structure is inhibited. In the resulting device 14 shown in FIG. 4c, therefore, the reduced volume of crystalline layer 13 causes this layer to act a stressor layer for nanowire 10, inducing tensile radial strain, whereupon the nanowire expands radially outwardly as indicated by the arrows in the figure. Again, longitudinal strain is inhibited in this example by the nanowire end supports. With the materials and parameters described above, and with appropriate choice of carrier type and current flow direction (electrons on (100) or (110) surfaces), an improvement in carrier mobility of about 20 to 50 percent can be expected as a result of the radial tensile strain in this example.

As before, the device 14 may subsequently undergo further processing steps and particular examples are described below. The tensile strain could of course be made compressive if desired for other embodiments by exploiting the reverse phase change. Other phase change materials, such as amorphous Si or carbon could be used instead of chalcogenides if desired. Other techniques involving post-processing to activate a stressor layer could also be employed. For example, a volume change could be effected by processing to effect release or absorption of a substance, e.g. a gas such as hydrogen, which can penetrate through a fixation layer, e.g. of Nb metal. Lithium uptake of a lithium alloy by electrochemical reaction using solid state diffusion provides another example here. Note that not all such post-processing techniques will necessarily require use of a fixation layer. Also, while the fixation layer is a thin stratum above this could be implemented by bulk material in some embodiments.

Figure 5A:
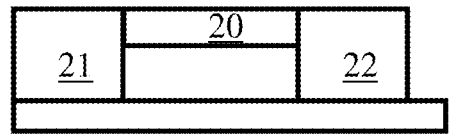
FIGS. 5a to 5e illustrate a third method embodying the invention for forming a nanowire device.
Figure 5B:
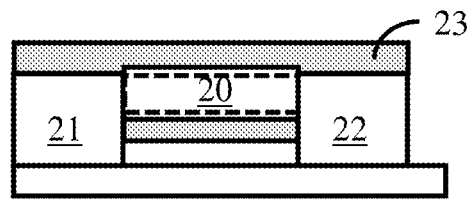
Figure 5C:
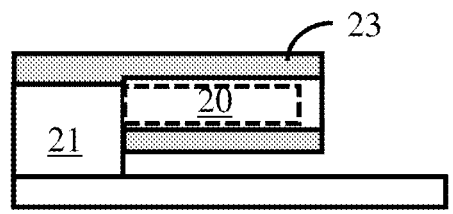
Figure 5D:
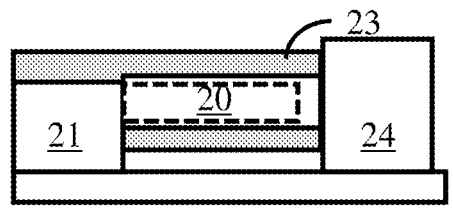

FIGS. 5a to 5e are schematic illustrations of successive stages in a third method embodying the invention. The first stage involves fabrication of a semiconductor nanowire 20 fixed to end supports 21, 22 generally as described with reference to FIG. 3a above. In this example, the nanowire is formed from Si and has a diameter of approximately 5 to 20 nm. Next, a stressor layer 23 is formed on the nanowire and end supports as shown in FIG. 5b. The stressor layer 23 here is a layer of $Si_xN_y$ formed by CVD to a thickness of about 10 to 20 nm. This stressor layer induces tensile radial strain resulting in expansion of nanowire 20 as indicated in the figure. At this stage, the end supports 21, 22 prevent the nanowire from taking up longitudinal strain. In the next step shown in FIG. 5c, the end support 22 is removed by lithographic processing. The nanowire 20, thus freed at one end, is then subjected by the stressor layer to tensile longitudinal strain, expanding longitudinally as indicated. In the next step, a new end support 24 is formed, this support being attached to the free end of nanowire 20 as shown in FIG. 5d. In this example, the new end support 24 is formed by epitaxial growth of the same material as old support 22. The nanowire 20, now supported at both ends, is still subject to longitudinal and radial strain as indicated. Next, the stressor layer 23 is removed by a process of dry etching. In the resulting device 25 shown in FIG. 5e, the radial strain in the nanowire has been eliminated through removal of the stressor layer. However, the longitudinal strain due to the previous effect of the stressor layer is maintained by the end supports 21, 24.

With the materials and parameters described in this example, and with appropriate carrier type and current flow direction (electrons on (100) and (110) surfaces), an improvement in carrier mobility of approximately 10 to 20 percent can be expected as a result of the longitudinal tensile strain. The tensile longitudinal strain could of course be made compressive if desired for other embodiments. Also, in some embodiments it may be desirable to stop at the stage of FIG. 5d to maintain both longitudinal and radial strain components. In addition, in other embodiments steps 5c to 5e might be applied to nanowires of FIGS. 3b and 4c produced by the methods described earlier. Further, the new end support 24 may serve as an electrode contacting the nanowire and could be made of a different material, such as a metal formed by a metal deposition technique. Embodiments might also be envisaged where the nanowire is freed in step 5c by only partially removing the original support 22 just sufficiently to free the nanowire to take up the longitudinal strain. Also, instead of initially forming a nanowire fixed at both ends as in FIG. 5a, a nanowire may be formed which is fixed at only one end. In particular, such nanowires can be formed which extend perpendicularly, rather than parallel, to the substrate. The substrate then serves as a support at one end of the nanowire, the other end being free. The stressor layer can then be applied to this cantilever nanowire structure whereby the nanowire is subjected to radial and longitudinal strain by the stressor layer.

Figure 6A:
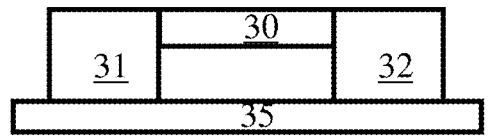
FIGS. 6a to 6e illustrate a fourth method embodying the invention for forming a nanowire device.
Figure 6B:
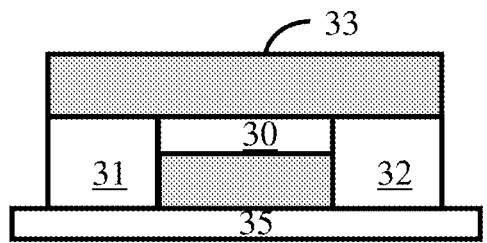
Figure 6C:
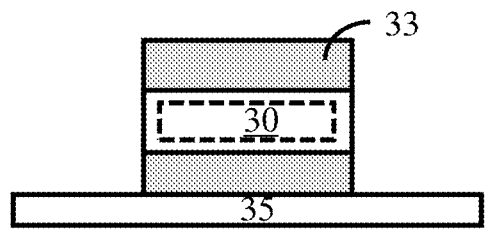
Figure 6D:
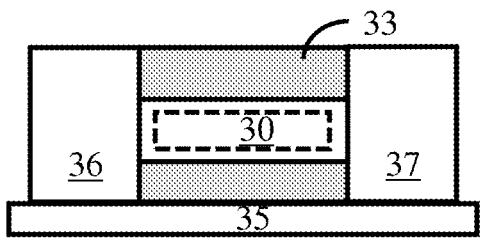

An alternative method of achieving only longitudinal strain in a nanowire is indicated in FIGS. 6a to 6e. Materials and processing steps here are assumed to be generally as those of the previous method and only key differences will be described in the following. In step 6b of this method, a stressor layer 33 is formed to a thickness sufficient to fill the gap between nanowire 30 and the substrate 35. Next, both end supports 31 and 32 are removed. This leaves the nanowire free at both ends and supported by the stressor layer 33 whereby the nanowire is subjected to both longitudinal and radial strain as indicated. Next, two new supports 36, 37 are formed attached to respective ends of the nanowire as shown in FIG. 6d. Finally, the stressor layer is removed, eliminating the radial strain. In the final device 38 of this embodiment, however, the longitudinal strain due to the previous effect of the stressor layer is maintained by the new end supports 36, 37.

Figure 5E:
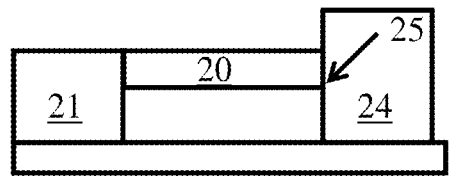
Figure 6E:
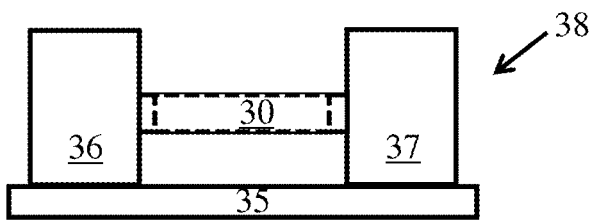

FIG. 7 shows an example of a nanowire FET device embodying the invention. The device 40 of this example is formed by first producing a device as shown in FIG. 5e or 6e by a method as described above. The end supports for the longitudinally-strained nanowire 41 serve as source and drain contact pads 42, 43. A surround-gate structure is then formed around a central channel portion of the nanowire 41 via generally known processing techniques. The gate structure includes a gate dielectric 44, which may comprise one or more layers of insulating material, formed around nanowire 41. A metal or polysilicon gate contact 45 is then formed around the dielectric. Gate length is defined to leave exposed regions of nanowire 41 between the gate stack and the source and drain regions respectively. Finally, an additional layer 46 is deposited to enclose the gate structure and exposed regions of the nanowire between the source and drain pads. The layer 46 in this example is formed of $Si_xN_y$ deposited by CVD, and serves as a further stressor layer for the already-longitudinally-strained nanowire 41. This stressor layer applies additional radial stress to the regions of nanowire between the gate and the source/drain to further enhance performance.

It will be seen that the embodiments described above permit tensile or compressive radial and longitudinal strain components to be exploited separately or together to enhance nanowire conductivity. Through use of a stressor layer as described above, the entire nanowire core can contribute to conductivity and desired strain characteristics can be formulated to optimize nanowire performance.

It will of course be appreciated that many changes and modifications can be made to the exemplary embodiments described. For example, nanowires need not have circular cross-sections. In general, any nanowire cross section may be employed providing the nanowire is accessible from all sides around its circumference (as opposed to e.g. a fin-type structure which is joined to support along its length) to permit formation of the stressor layer circumferentially surrounding the nanowire. The stressor layer can of course be applied to a nanowire which already has other structures formed thereon, the methods described above being applied to produce radial and/or longitudinal strain in the exposed sections of the nanowire. For example, the described methods can be applied to a nanowire having an existing surround-gate structure formed thereon to achieve a FET device similar to that of FIG. 7. As discussed earlier, alternative embodiments may also convert a semi-metal nanowire to a semiconductor nanowire under strain induced by the stressor layer.

While simple nanowire devices and FET devices based thereon have been described above, methods embodying the invention can be applied in general to produce any device in which a nanowire is employed as a conductor. Particular examples include thermoelectric converters, nanowire sensors, and optoelectronic devices such as LEDs (light emitting diodes). As mentioned earlier, the nanowires may also be formed perpendicularly to the substrate, giving a vertical device geometry.

Many other changes and modifications can be made to the embodiments described without departing from the scope of the invention.

The invention claimed is:

1. A method for forming a nanowire device, comprising:
    forming a semiconductor nanowire between a first support and a second support;
    forming a stressor layer circumferentially surrounding the semiconductor nanowire, wherein, due to the stressor layer, the nanowire is subjected to radial strain; and
    freeing the nanowire from at least one of the first support and the second support so as to further subject the nanowire to longitudinal strain to enhance carrier mobility in the nanowire.

2. The method of claim 1, wherein the nanowire is formed by semiconducting material.

3. The method of claim 1, wherein the nanowire is formed by semi-metal material, and wherein said strain induced by the stressor layer renders the semi-metal material semiconducting.

4. The method of claim 1, wherein forming the stressor layer comprises material which is inherently adapted to apply stress to the nanowire.

5. The method of claim 1, further comprising removing only the first support following forming the stressor layer.

6. The method of claim 5, further comprising replacing the removed first support with a new support.

7. The method of claim 6, further comprising:
    removing the stressor layer from the nanowire, whereby any radial strain due to the stressor layer is eliminated, while the longitudinal strain is maintained due to the second support and the new support.

8. The method of claim 1, wherein the stressor layer comprises a substantially homogeneous coating.

9. The method of claim 1, wherein the nanowire comprises a rounded cross-section.

10. The method of claim 1, wherein the stressor layer is formed at a thickness sufficient to fill a gap between the nanowire and a substrate supporting the first and second support.

11. The method of claim 10, further comprising removing both the first support and the second support following forming the stressor layer.

12. The method of claim 11, further comprising replacing the removed first support and second support with new supports.

13. The method of claim 12, further comprising:
    removing the stressor layer from the nanowire, whereby any radial strain due to the stressor layer is eliminated, while the longitudinal strain is maintained due to the new supports.

* * * * *